United States Patent [19]
Sekiguchi

[11] Patent Number: 6,025,688
[45] Date of Patent: *Feb. 15, 2000

[54] ALIGNMENT APPARATUS

[75] Inventor: Hiroyuki Sekiguchi, Utsunomiya, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/629,748

[22] Filed: Apr. 9, 1996

[30] Foreign Application Priority Data

Apr. 11, 1995 [JP] Japan .................................. 7-109183

[51] Int. Cl.$^7$ .................................. G65B 11/42
[52] U.S. Cl. .................. 318/610; 318/649; 318/652; 364/157; 364/162
[58] Field of Search .................. 318/609, 610, 318/649, 652; 364/157, 162, 163

[56] References Cited

U.S. PATENT DOCUMENTS

| | | | |
|---|---|---|---|
| 4,374,349 | 2/1983 | Inaba et al. | 318/568 |
| 4,520,779 | 6/1985 | Kubach | 123/357 |
| 5,040,431 | 8/1991 | Sakino et al. | 74/479 |
| 5,184,055 | 2/1993 | Ohishi et al. | 318/615 |
| 5,223,778 | 6/1993 | Svarovsky et al. | 318/610 |
| 5,229,699 | 7/1993 | Chu et al. | 318/610 |
| 5,323,012 | 6/1994 | Auslander et al. | 250/492.2 |
| 5,347,445 | 9/1994 | Moosmann et al. | 364/148 |
| 5,408,591 | 4/1995 | Shih et al. | 395/104 |
| 5,446,519 | 8/1995 | Makinouchi | 318/649 |
| 5,726,542 | 3/1998 | Ebihara | 318/649 |

FOREIGN PATENT DOCUMENTS

| | | |
|---|---|---|
| 0047113A2 | 3/1982 | European Pat. Off. . |
| 0491445A2 | 6/1992 | European Pat. Off. . |
| 3042917A1 | 7/1982 | Germany . |
| 3439495A1 | 5/1985 | Germany . |
| 61-256414 | 11/1986 | Japan . |

OTHER PUBLICATIONS

English Abstract of German Patent No. 3439495, May 1985.
English Abstract of German Patent No. 3042917, Jul. 1982.
English Abstract of European Patent No. 491445, Jun. 1992.
EPE '89 3rd European Conference on Power Electronics and Applications, vol. 3, Oct. 9–12, 1989, Aachen, Germany, pp. 1375–1390, XP000143563 Dusan Borojevic: "Robust Nonlinear Control Algorithm For Fast Positioning in Servo Drives".
Patent Abstracts of Japan vol. 10, No. 74 (P–439) [2131], published Mar. 25, 1986, English Abstract of JP 60 214018A, published Oct. 26, 1985.
Patent Abstracts of Japan vol. 10, No. 312 (P–509) [2368], published Oct. 23, 1986, English Abstract of JP 61 122718A, published Jun. 10, 1986.

*Primary Examiner*—David Martin
*Attorney, Agent, or Firm*—Fitzpatrick, Cella, Harper & Scinto

[57] ABSTRACT

An apparatus for moving a stage, supported by a base, to a target position. The apparatus includes a motor for driving the stage in X and Y directions, a laser interferometer for measuring a current position of the stage in the X and Y directions and a controller for generating a control signal for controlling the motor to move the stage to the target position in the X and Y directions on the basis of the target position and for dynamically setting a transfer function associated with generation of the control signal in correspondence with the current measured position. The controller sets the transfer function so that a gain decreases as the stage moves toward a peripheral portion of the base.

7 Claims, 5 Drawing Sheets and the Y-stage 72 shown in FIG. 4. Referring to FIG. 5, reference
ALIGNMENT APPARATUS

BACKGROUND OF THE INVENTION

The present invention relates to an alignment apparatus for a movable member and, more particularly, to an alignment apparatus for a movable member, which requires high-precision alignment.

FIG. 4 shows an example of an X-Y stage of an alignment apparatus. Referring to FIG. 4, reference numeral 70 denotes a base; 71 denotes an X-stage; 72, a Y-stage; 73 denotes a yaw guide; 74 denotes an air pad; 75 denotes a linear motor for driving the X-stage; 76 denotes a linear motor for driving the Y-stage; 77 denotes a measurement mirror; 78 denotes a Y-stage position measurement mirror surface; 79 denotes an X-stage position measurement mirror surface; 80 denotes an X-stage position measurement laser beam emitted by a laser interferometer; and 81 denotes a Y-stage position measurement laser beam emitted by a laser interferometer. The X-stage 71 and the Y-stage 72 are respectively direct drive stages driven by a linear motor using a static pressure air pad. The X-stage position measurement laser beam 80 emitted by the laser interferometer irradiates the X-stage position measurement mirror surface 79 to measure the position of the X-stage 71, and the X-stage 71 is aligned to a target position. The Y-stage position measurement laser beam 81 emitted by the laser interferometer irradiates the Y-stage position measurement mirror surface 78 to measure the position of the Y-stage 72, and the Y-stage 72 is aligned to a target position.

FIG. 5 is a block diagram of an alignment apparatus for controlling the X-Y stage having the X-stage 71 and the Y-stage 72 shown in FIG. 4. Referring to FIG. 5, reference numeral 1 denotes an X-Y stage having the X-stage 71 and the Y-stage 72; 2 denotes a motor for driving the X-Y stage 1; 3 denotes a driver for supplying a current to the motor 2; 4 denotes a compensator used for stably controlling the X-Y stage 1 with high precision; 5 denotes a subtracter for calculating the difference between the current position and the target position; 6 denotes a laser interferometer for measuring the position of the X-Y stage 1; and 7 denotes a register for holding the target position. Note that the transfer function of the compensator 4 can be expressed by equation (1) below in the case of, e.g., PID control:

$$G(s) = k_p + \frac{k_i}{s} + k_d S \quad (1)$$

where s is a Laplace's operator.

Conventionally, in such an alignment apparatus, the gains, i.e., $k_p$, $k_i$, and $k_d$, of the compensator 4 are fixed independently of the current position of the X-Y stage 1.

However, the mechanical characteristics of the X-Y stage 1 inevitably change, depending on the current position of the X-Y stage.

For this reason, in the above-mentioned example, since the gains of the compensator 4 are fixed independently of the current position of the X-Y stage 1, alignment precision at a certain position may be good, but the system may become unstable and oscillate at another position. If the gains are lowered to stabilize the system at every position, the alignment precision deteriorates.

The present invention has been made in consideration of the conventional problems and has as its object to provide an alignment apparatus which is stable and assures high precision at every position on the X-Y stage.

SUMMARY OF THE INVENTION

In order to solve the above-mentioned problem, an alignment apparatus of the present invention comprises the following features. That is, an alignment apparatus for moving a movable member to a target position, comprises driving means for driving the movable member, measurement means for measuring a position of the movable member, control means for generating a control signal for controlling the driving means to move the movable member to the target position, on the basis of the target position, and control characteristic setting means for sequentially setting a transfer function associated with generation of the control signal in the control means in correspondence with the measured position.

The alignment apparatus of the present invention preferably comprises the following features. That is, in the alignment apparatus of the present invention, the control means preferably generates the control signal by feeding back the position measured by the measurement means.

In the alignment apparatus of the present invention, the control means preferably generates the control signal by amplifying a difference between the target position and the measured position with a characteristic determined by the transfer function.

In the alignment apparatus of the present invention, the control characteristic setting means preferably sets the transfer function on the basis of a function which defines the transfer function corresponding to the measured position.

In the alignment apparatus of the present invention, the control characteristic setting means preferably sets the transfer function to obtain a small gain on a peripheral portion of a range in which the movable member can be moved by the driving means.

In the alignment apparatus of the present invention, the driving means preferably comprises x-axis driving means for moving the movable member along an x-axis direction, and y-axis driving means for moving the movable member along a y-axis direction.

In the alignment apparatus of the present invention, preferably, the transfer function includes proportional, integral, and derivative elements, and the control characteristic setting means sets the proportional, integral, and derivative elements of the transfer function on the basis of a function for defining the transfer function corresponding to the measured position.

In the alignment apparatus of the present invention, the control characteristic setting means preferably sets the transfer function on the basis of a table which defines the transfer function corresponding to a region including the measured position.

In the alignment apparatus of the present invention, preferably, the transfer function includes proportional, integral, and derivative elements, and the control characteristic setting means sets the proportional, integral, and derivative elements of the transfer function on the basis of the table.

Further objects, features and advantages of the present invention will become apparent from the following detailed description of embodiments of the present invention with reference to the accompanying drawings.

DESCRIPTION OF THE PREFERRED EMBODIMENTS

Figure 1:
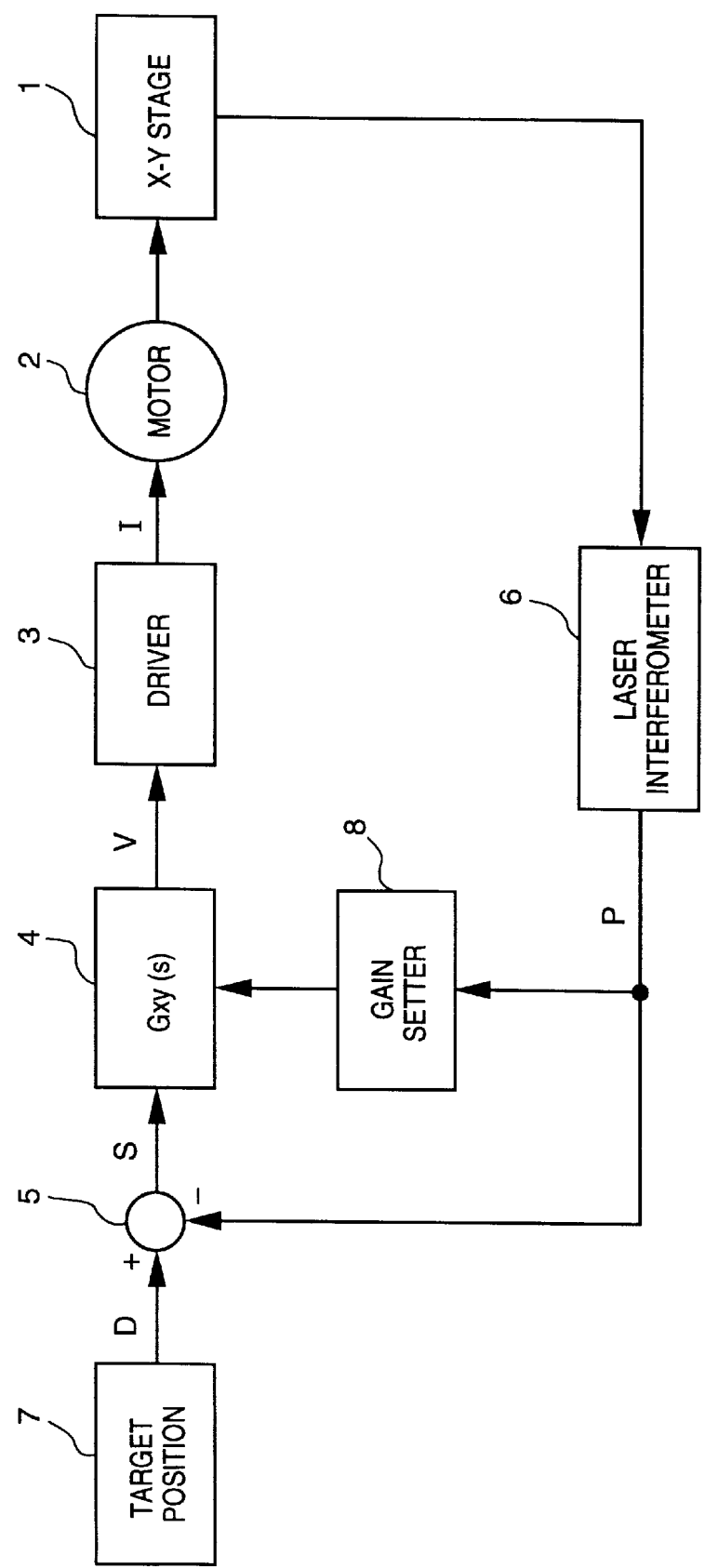
FIG. 1 is a block diagram showing the arrangement of an alignment apparatus according to an embodiment of the present invention.
Figure 4:
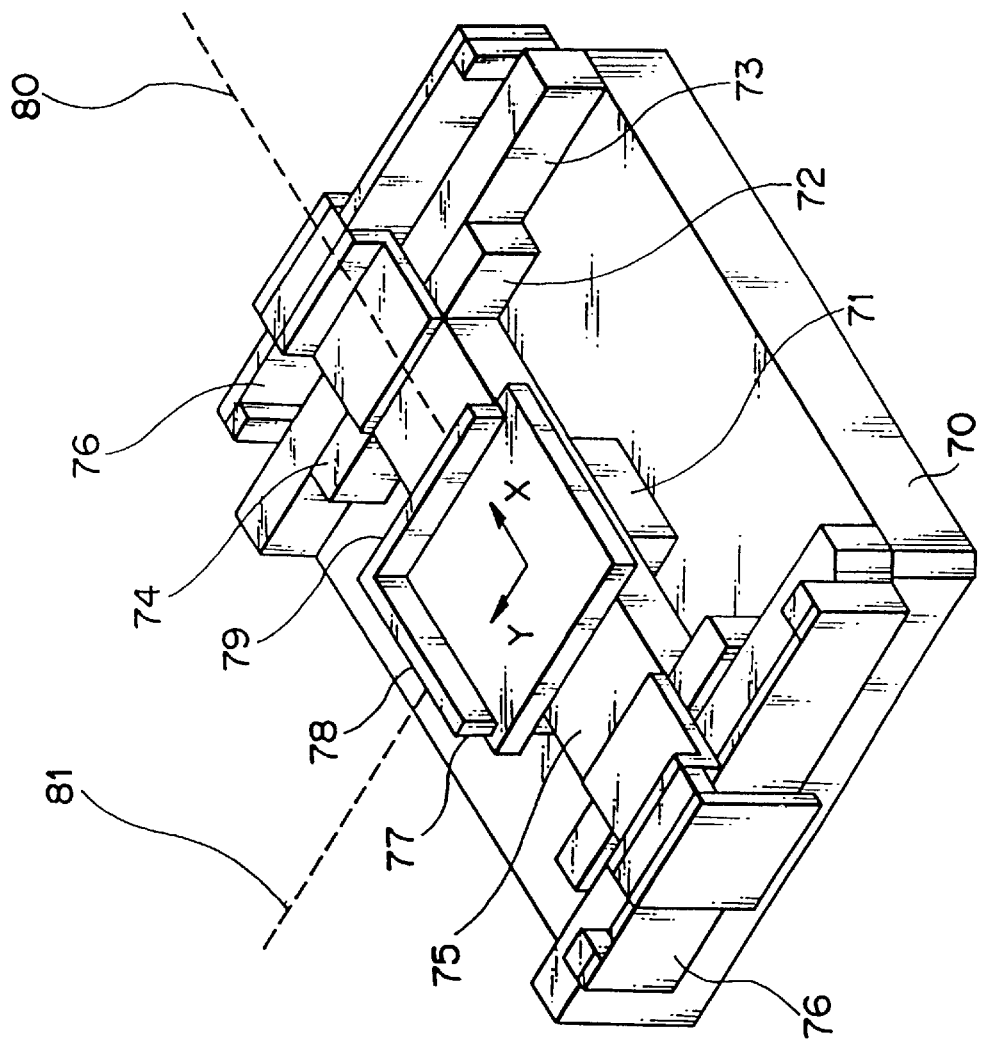
FIG. 4 is a perspective view showing the arrangement of an X-Y stage to which the present invention can be applied.
Figure 5:
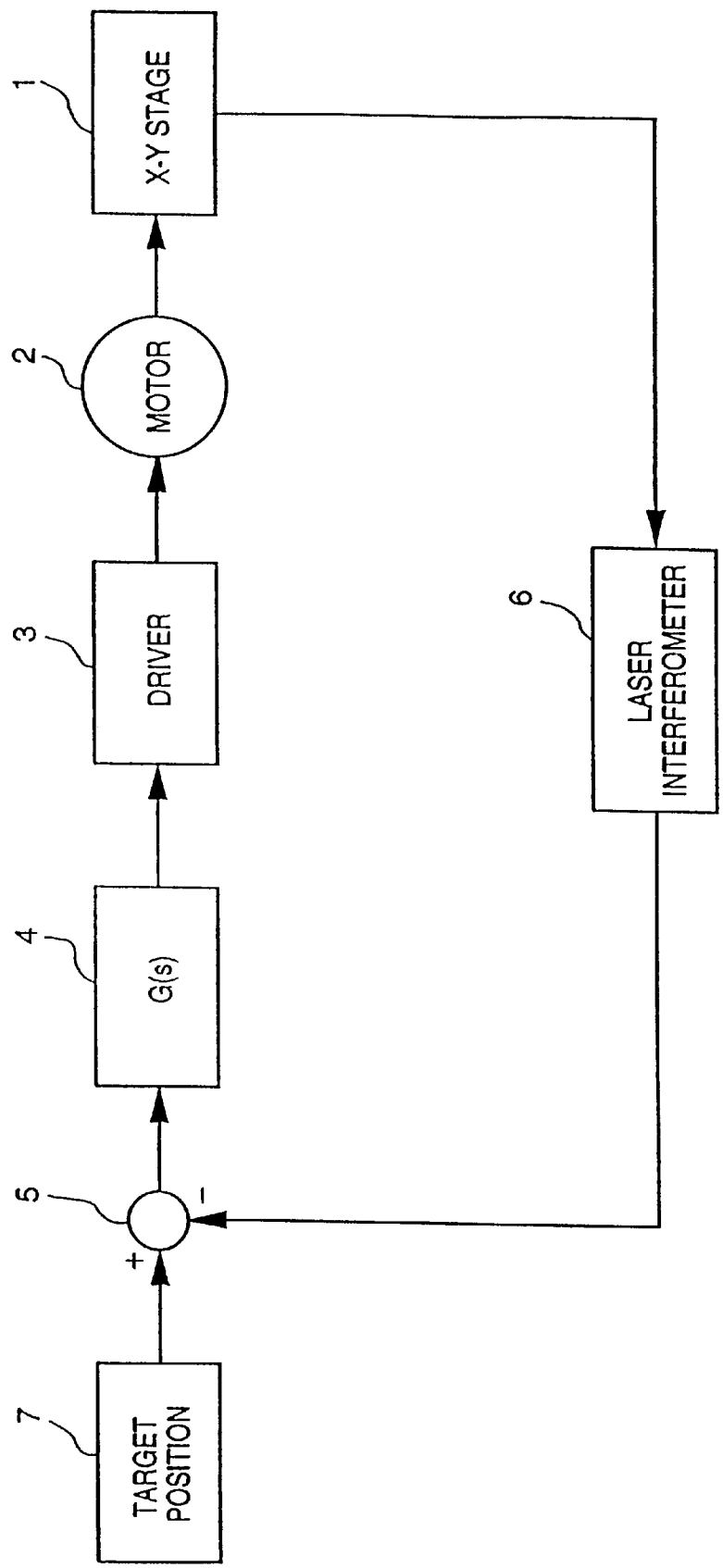
FIG. 5 is a block diagram showing the arrangement of a conventional alignment apparatus.

FIG. 1 is a block diagram showing an alignment apparatus for aligning an X-Y stage shown in FIG. 4 according to an embodiment of the present invention. Referring to FIG. 1, reference numeral 1 denotes an X-Y stage having the X-stage 71 and the Y-stage 72; 2 denotes a motor for driving the X-Y stage 1; 3 denotes a driver for supplying a current to the motor 2; 4 denotes a compensator used for stably controlling the X-Y stage 1 with high precision; 5 denotes a subtracter for calculating the difference between the current position and the target position; 6 denotes a laser interferometer for measuring the position of the X-Y stage 1; 7 denotes a register for holding the target position; and 8 denotes a gain setter for dynamically setting the transfer function, Gxy(s), of the compensator 4 in correspondence with the current position of the X-Y stage 1.

The position, P(x, y), of the X-Y stage 1 is measured by the laser interferometer 6, and the deviation, S(x, y), from a target position D(x, y) is calculated by the subtracter 5. The deviation S(x, y) is converted into an instruction V(x, y) to be supplied to the driver 3 by the compensator 4, and the driver 3 supplies a current I to the motor 2 in accordance with the instruction V(x, y), thereby aligning the X-Y stage 1 to the target position.

The gain setter 8 sets the transfer function Gxy(s) of the compensator 4, given by equation (2) below, in accordance with the position P(x, y) of the X-Y stage 1:

$$Gxy(s) = k_p(x, y) + \frac{k_i(x, y)}{s} + k_d(x, y)s \quad (2)$$

where $k_p(x, y)$, $k_i(x, y)$, and $k_d(x, y)$ are respectively the proportional, integral, and derivative gains, and are two-dimensional functions of the position P(x, y) of the X-Y stage 1. Note that different transfer functions Gxy(s) may be set for X- and Y-stages 71 and 72. However, in the following description, assume that the X- and Y-stages 71 and 72 are controlled by an identical transfer function Gxy(s).

Figure 2:
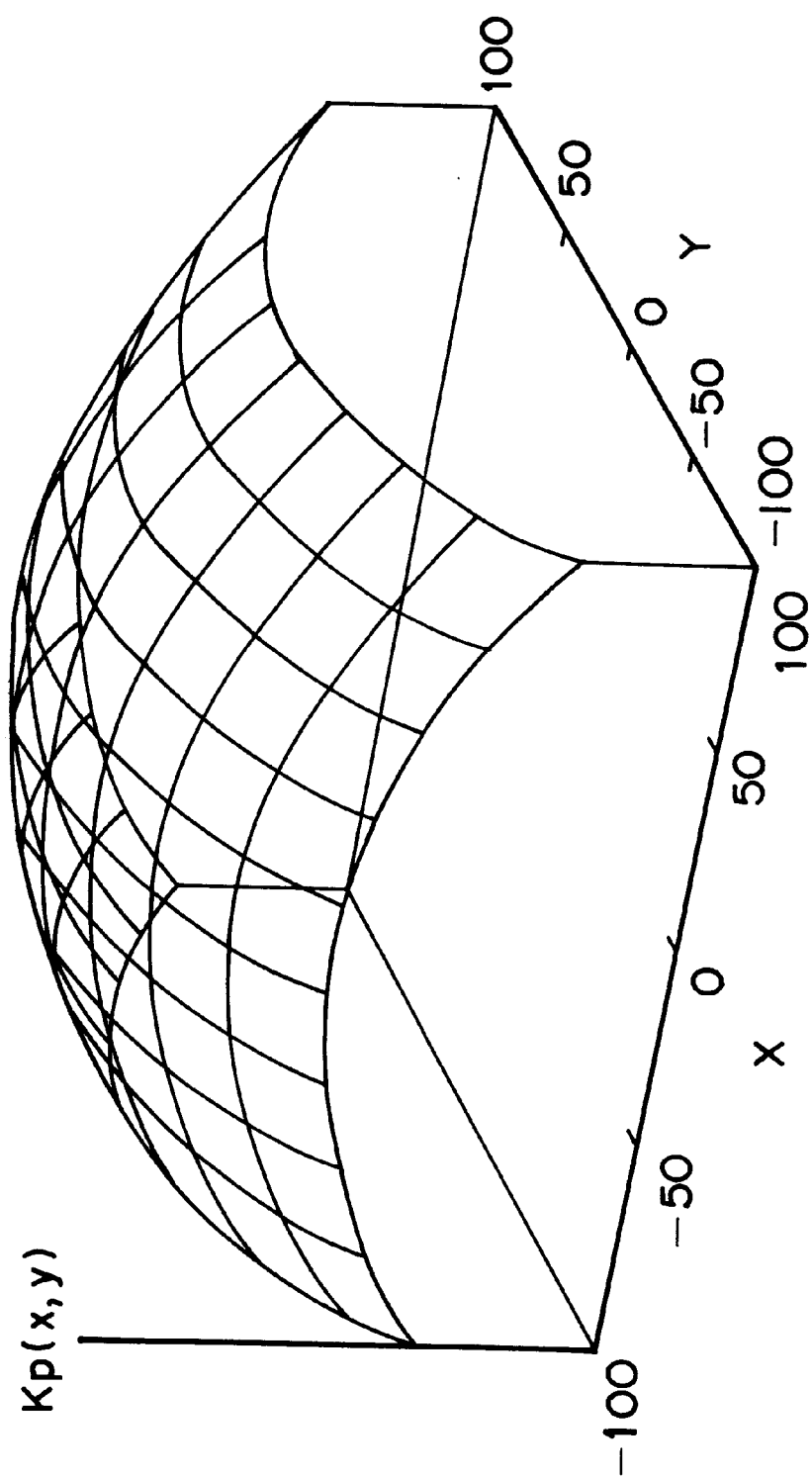
FIG. 2 is a graph showing an example of proportional gain $k_p(x, y)$ as one element of the transfer function, which is set by a gain setter on the basis of the position of an X-Y stage 1.

FIG. 2 shows an example of the proportional gain $k_p(x, y)$, which is expressed by equation (3) below. In an example illustrated in FIG. 2, the movable region of each of the X- and Y-stages 71 and 72 falls within the range from −100 to 100.

$$k_p(x, y) = k_{p0} - \frac{x^2}{k_{p1}} - \frac{y^2}{k_{p2}} \quad (3)$$

In this equation, the closer the X-Y stage 1 approaches the four corners of the movable range, the lower the gain becomes. The integral gain $k_i(x, y)$ and the derivative gain $k_d(x, y)$ are similarly expressed by equations (4) and (5) below:

$$k_i(x, y) = k_{i0} - \frac{x^2}{k_{i1}} - \frac{y^2}{k_{i2}} \quad (4)$$

$$k_d(x, y) = k_{d0} - \frac{x^2}{k_{d1}} - \frac{y^2}{k_{d2}} \quad (5)$$

According to the gain $k_p(x, y)$, $k_i(x, y)$, and $k_d(x, y)$ of this compensator 4, even on the X-Y stage 1 whose mechanical characteristics (e.g., attenuation factor) deteriorate as the position of the X-Y stage 1 approaches the four corners of the movable range, the gains change in correspondence with the mechanical characteristics according to the position of the X-Y stage 1. For this reason, stable, high-precision performance can be obtained independently of the current position of the X-Y stage 1. Note that equations other than equations (2) to (5) above may be applied in correspondence with the characteristics of a control system.

Figure 3:
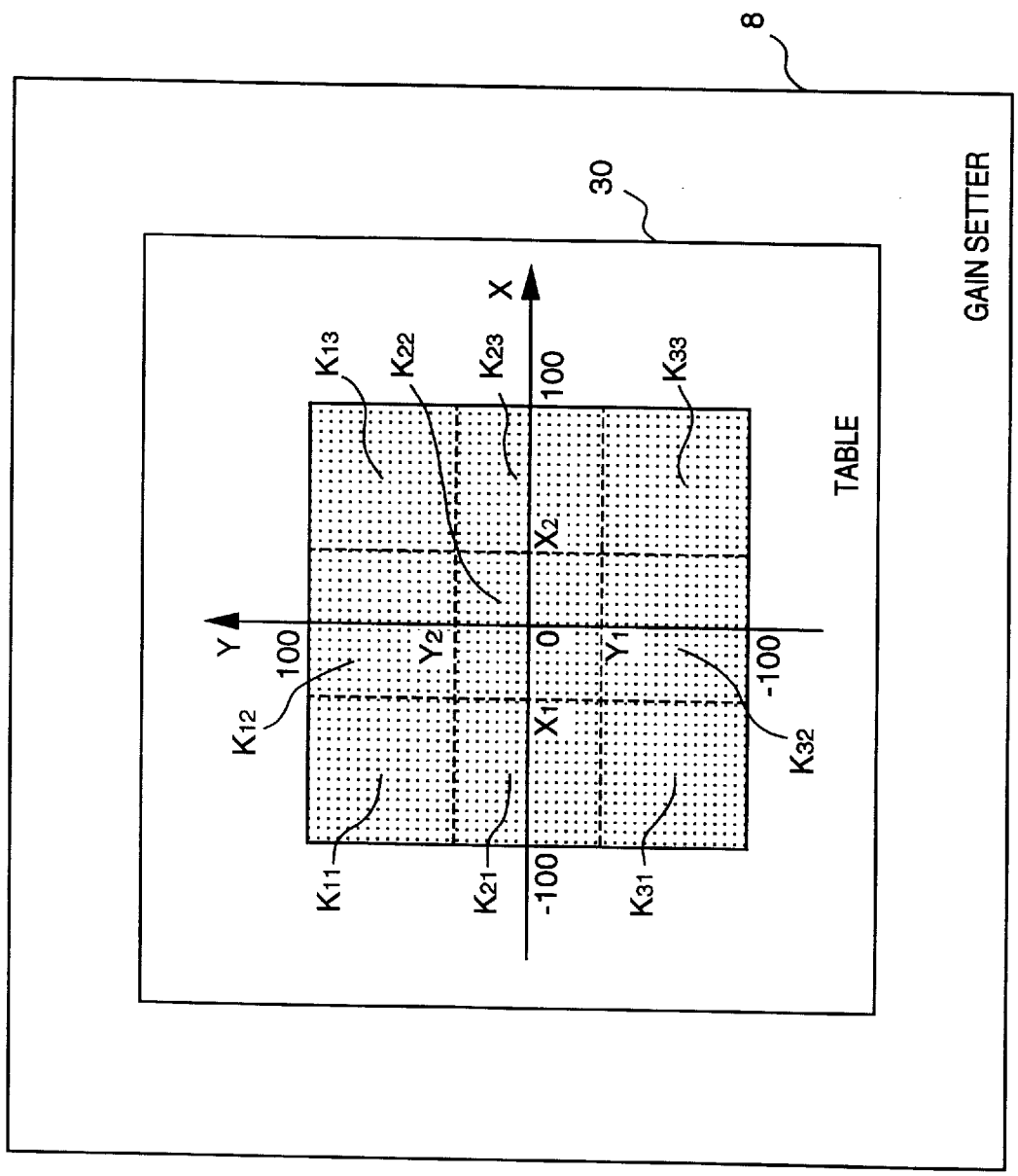
FIG. 3 is a view for explaining a method of setting the transfer function according to another embodiment of the present invention, i.e., a method of setting the respective elements of the transfer function by looking up a table.

The transfer function Gxy(s) of the compensator 4 may be determined by looking up data in a table. An embodiment wherein each element (e.g., the proportional gain) of the transfer function Gxy(s) of the compensator 4 is set by looking up a table will be explained below. This embodiment assumes a plurality of regions obtained by dividing the moving range of the X-Y stage 1, and the transfer function is set by looking up values in a table, which stores preferable gain values $k_{ij}$ used when the X-Y stage 1 is located in the respective regions. FIG. 3 shows the table allocated in the gain setter 8. A table 30 holds gains $k_{11}$ to $k_{33}$ corresponding to the respective divided regions. Using this table 30, the gain setter 8 sets the gain k in correspondence with the mechanical characteristics in a region where the X-Y stage 1 is currently located, thus obtaining stable, high-precision alignment performance independently of the current position of the X-Y stage 1. According to this embodiment, since the gain $k_{ij}$ can be easily obtained by looking up values in the table 30 in correspondence with the position of the X-Y stage 1, the gain setter can be constituted by a microprocessor with low processing performance or a simple hardware arrangement. When the proportional, integral, and derivative gains are set by looking up values in a table, the tables 30 corresponding to these gains may be prepared. In FIG. 3, however, only one table is shown, for the sake of simplicity.

In the above description, the present invention is applied to an X-Y stage alignment apparatus based on a feedback control system. Also, the present invention may be applied to a case wherein the above-mentioned gain setter is added to a feedforward control system. The present invention can also be applied to various other control apparatuses.

As described above, according to the present invention, in an alignment apparatus in which mechanical characteristics change depending on the position of a movable member, since the gain of a compensator serving as a control means changes in correspondence with the position of the movable member, stable, high-precision control characteristics can be obtained at every position of the movable member by setting the gain in correspondence with the current position of the movable member.

The present invention is not limited to the above embodiments and various changes and modifications can be made within the spirit and scope of the present invention. Therefore, to apprise the public of the scope of the present invention the following claims are made.

What is claimed is:

1. An apparatus for moving a stage, supported by a base, to a target position, said apparatus comprising:

a motor for driving the stage in X and Y directions;

a laser interferometer for measuring a current position of the stage in the X and Y directions; and a controller for generating a control signal for controlling said motor to move the stage to the target position in the X and Y directions on the basis of the target position, and for dynamically setting a transfer function associated with generation of the control signal in correspondence with the current measured position, wherein said controller sets the transfer function so that a gain decreases as the stage moves toward a peripheral portion of the base.

2. The apparatus according to claim 1, wherein said controller generates the control signal by feeding back the current measured position.

3. The apparatus according to claim 2, wherein said controller generates the control signal by amplifying a difference between the target position and the current measured position in accordance with the transfer function.

4. The apparatus according to claim 3, wherein said controller sets the transfer function on the basis of a predetermined function which defines the transfer function corresponding to the current measured position.

5. The apparatus according to claim 4, wherein the transfer function includes proportional, integral, and derivative elements, and said controller sets the proportional, integral, and derivative elements of the transfer function on the basis of the predetermined function.

6. The apparatus according to claim 3, wherein said controller sets the transfer function on the basis of a predetermined table which defines the transfer function corresponding to a region including the current measured position.

7. The apparatus according to claim 6, wherein the transfer function includes proportional, integral, and derivative elements, and said controller sets the proportional, integral, and derivative elements of the transfer function on the basis of the predetermined table.

* * * * *